United States Patent
Park

(10) Patent No.: US 10,473,726 B2
(45) Date of Patent: Nov. 12, 2019

(54) BATTERY MANAGEMENT METHOD AND BATTERY MANAGEMENT APPARATUS

(71) Applicant: SAMSUNG ELECTRONICS CO., LTD., Suwon-si (KR)

(72) Inventor: Jeonghyun Park, Yongin-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 250 days.

(21) Appl. No.: 15/397,875

(22) Filed: Jan. 4, 2017

(65) Prior Publication Data

US 2017/0192061 A1 Jul. 6, 2017

(30) Foreign Application Priority Data

Jan. 4, 2016 (KR) .................. 10-2016-0000252

(51) Int. Cl.
| | | |
|---|---|---|
| G01R 31/396 | (2019.01) | |
| H02J 7/00 | (2006.01) | |
| B60L 58/10 | (2019.01) | |
| G01R 31/367 | (2019.01) | |
| G01R 31/392 | (2019.01) | |

(52) U.S. Cl.
CPC ............ G01R 31/396 (2019.01); B60L 58/10 (2019.02); G01R 31/367 (2019.01); H02J 7/0021 (2013.01); H02J 7/0047 (2013.01); G01R 31/392 (2019.01); H02J 2007/005 (2013.01); Y02T 10/705 (2013.01); Y02T 10/7005 (2013.01)

(58) Field of Classification Search
CPC ............ G01R 31/3658; G01R 31/3679; H02J 2007/005; H02J 7/0047; H02J 7/0021; B60L 11/1851
See application file for complete search history.

(56) References Cited

U.S. PATENT DOCUMENTS

| | | | | |
|---|---|---|---|---|
| 6,054,840 | A | * | 4/2000 | Nakanishi ............ H02J 7/0011 320/118 |
| 2005/0212486 | A1 | * | 9/2005 | Nakada ................ H02J 7/0016 320/132 |
| 2010/0253149 | A1 | | 10/2010 | Iida et al. |
| 2013/0002203 | A1 | * | 1/2013 | Kuraishi .............. H02J 7/0018 320/134 |
| 2014/0372053 | A1 | | 12/2014 | Lin et al. |

FOREIGN PATENT DOCUMENTS

| | | |
|---|---|---|
| JP | 10-111348 A | 4/1998 |
| JP | 2011-113688 A | 6/2011 |
| JP | 4818808 B2 | 11/2011 |
| JP | 2012-90392 A | 5/2012 |
| JP | 5586219 B2 | 9/2014 |

* cited by examiner

Primary Examiner — Mischita L Henson
(74) Attorney, Agent, or Firm — NSIP Law

(57) ABSTRACT

A battery management method includes verifying variance information of a physical quantity of each of a plurality of batteries, and identifying a target battery among the batteries based on the variance information. The battery management method also includes determining pack state information of a battery pack comprising the batteries based on state information of the target battery.

22 Claims, 13 Drawing Sheets

$$\text{Weight} = \frac{1}{\text{ranking}}$$

700

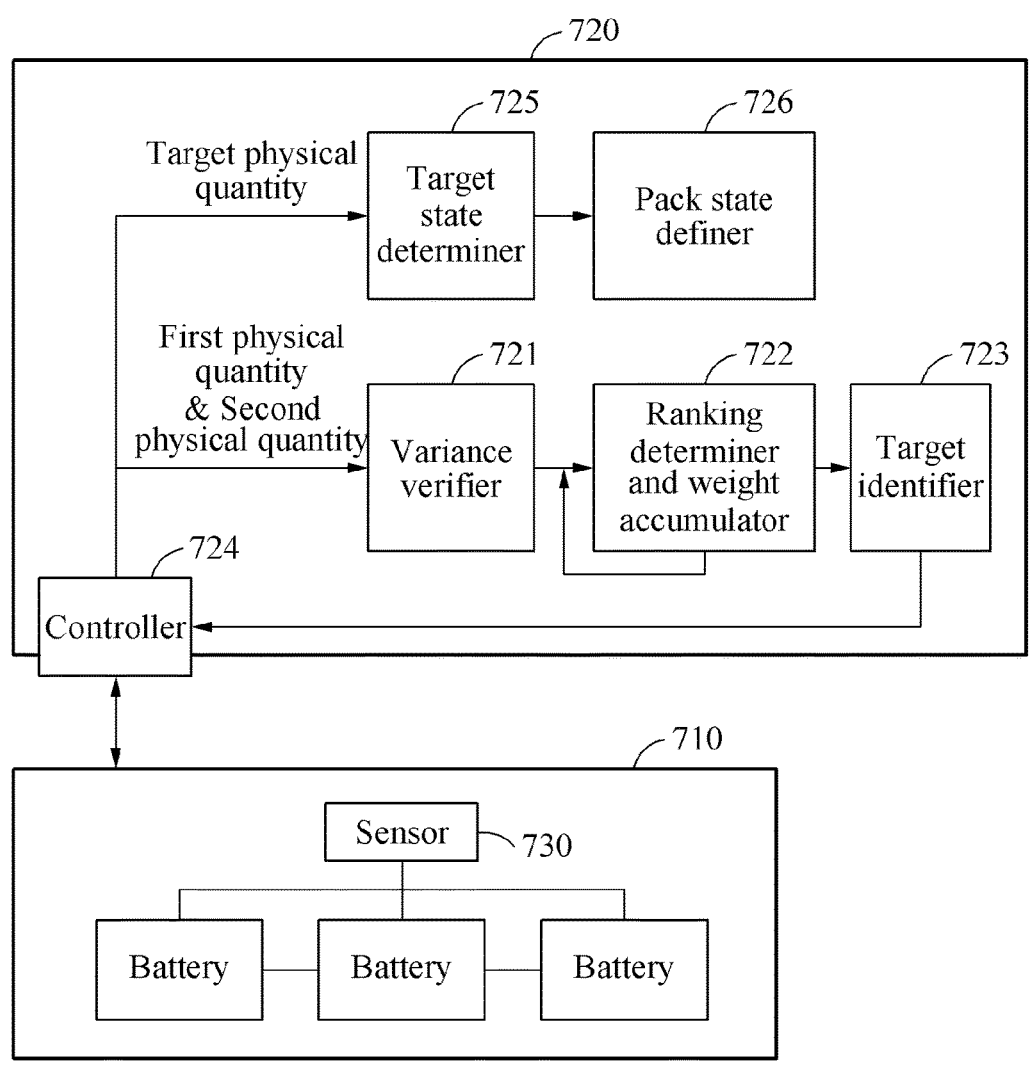

800

BATTERY MANAGEMENT METHOD AND BATTERY MANAGEMENT APPARATUS

CROSS-REFERENCE TO RELATED APPLICATION(S)

This application claims the benefit under 35 USC 119(a) of Korean Patent Application No. 10-2016-0000252, filed on Jan. 4, 2016, in the Korean Intellectual Property Office, the entire disclosure of which is incorporated herein by reference for all purposes.

BACKGROUND

1. Field

The following description relates to a battery management method and a battery management apparatus.

2. Description of Related Art

State information of a battery pack may be determined regarding the battery pack as a single cell. In this example, a reliability of the state information is relatively low because characteristics by a series/parallel structure of cells included in the battery pack and a degradation rate difference for each cell are not considered.

Further, state information of each of the cells included in the battery pack may be determined based on data of each of the cells, and the state information of the battery pack may be determined based on the state information of each of the plurality of cells. In this example, relatively accurate state information may be obtained. However, a relatively large amount of data may be needed to be processed creating an increased cost for a storage space and reducing a processing rate.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, there is provided a battery management method, including: verifying variance information of a physical quantity of each of a plurality of batteries; identifying a target battery among the batteries based on the variance information; and determining pack state information of a battery pack including the batteries based on state information of the target battery.

The identifying may include determining a ranking of each of the batteries based on the variance information; and identifying the target battery, among the batteries, based on the ranking.

The identifying may include determining a ranking of each of the batteries based on the variance information corresponding to a cycle; updating target identification information corresponding to each of the batteries based on a weight corresponding to the ranking; and identifying the target battery based on the updated target identification information.

Target identification information to be updated may correspond to a cumulative value of weights corresponding to rankings of each of the batteries, the rankings respectively determined in response to each of cycles previous to the cycle terminating.

The updated target identification information may correspond to a sum of target identification information to be updated and the weight.

The verifying may include calculating a difference value between a first physical quantity of each of the batteries at a start point of a cycle and a second physical quantity of each of the batteries at an end point of the cycle.

The identifying may include identifying the target battery, among the batteries, based on an absolute value of the difference value.

The determining may include receiving a target physical quantity of the target battery; determining the state information based on the target physical quantity; and determining the state information to be the pack state information.

The battery management method may further include generating a control signal to obtain the target physical quantity; and transmitting the control signal to the battery pack, wherein the receiving may include receiving the target physical quantity sensed by a sensor of the battery back.

The determining may exclude receiving of a physical quantity of other batteries and sensing of state information of the other batteries.

The variance information may correspond to a degradation degree of each of the plurality of batteries.

The variance information may correspond to a variance in the physical quantity during a cycle, and the cycle may include at least one of a full charge cycle, a full discharge cycle, a partial charge cycle, and a partial discharge cycle.

The physical quantity may include one of voltage, current, and temperature or a combination thereof and the variance information may include a voltage variance or a voltage slope.

The identifying may include defining the target battery as a battery including a relatively high degradation degree having a high variance information and with a high ranking relative to other of the batteries.

In accordance with an embodiment, there is provided a computer program embodied on a non-transitory computer readable medium, the computer program being configured to control a processor to perform the method described above.

In accordance with another embodiment, there is provided a battery management apparatus, including: a memory configured to store a physical quantity of each of a plurality of batteries; and a processor configured to identify a target battery, among the batteries, based on variance information of the physical quantity, and determine pack state information of a battery pack including the batteries based on state information of the target battery.

The processor may be configured to determine a ranking of each of the batteries based on the variance information, and identify the target battery, among the batteries, based on the ranking.

The processor may be configured to determine a ranking of each of the batteries based on the variance information corresponding to a cycle, update target identification information corresponding to each of the batteries based on a weight corresponding to the ranking, and identify the target battery based on the updated target identification information.

Target identification information to be updated may correspond to a cumulative value of weights corresponding to rankings of each of the batteries, the rankings respectively determined in response to each of cycles previous to the cycle terminates.

The updated target identification information may correspond to a sum of target identification information to be updated and the weight.

The processor may be configured to calculate a difference value between a first physical quantity of each of the batteries at a start point of a cycle and a second physical quantity of each of the batteries at an end point of the cycle.

In response to the target battery being identified, the processor is configured to receive a target physical quantity of the target battery through a communication interface, determine the state information based on the target physical quantity, and determine the state information to be the pack state information.

The variance information corresponds to a degradation degree of each of the batteries.

The variance information corresponds to a variance in the physical quantity during a cycle, and the cycle may include at least one of a full charge cycle, a full discharge cycle, a partial charge cycle, and a partial discharge cycle.

Other features and aspects will be apparent from the following detailed description, the drawings, and the claims.

BRIEF DESCRIPTION OF THE DRAWINGS

FIGS. 7A, 7B, 7C, and 7D illustrate examples of a battery system.

Figure 1:
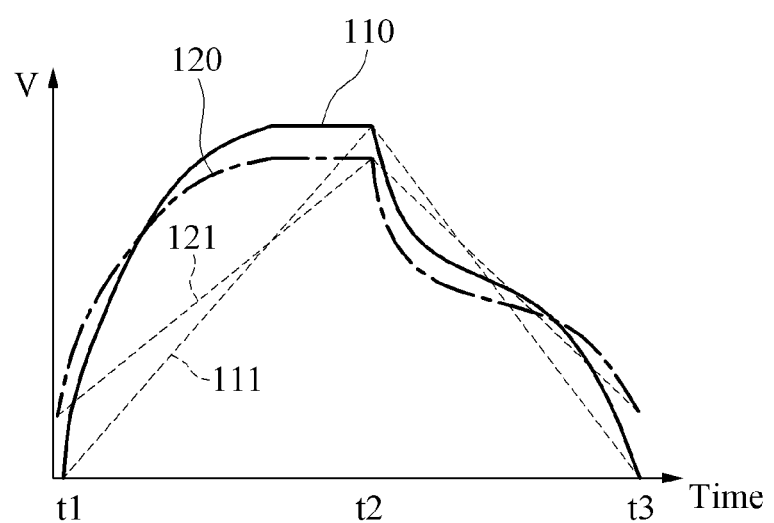
FIG. 1 is a graph illustrating an example of a degradation degree of a battery.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, reference will now be made in detail to examples with reference to the accompanying drawings, wherein like reference numerals refer to like elements throughout.

Various alterations and modifications may be made to the examples. Here, the examples are not construed as limited to the disclosure and should be understood to include all changes, equivalents, and replacements within the idea and the technical scope of the disclosure.

The terminology used herein is for the purpose of describing particular examples only and is not to be limiting of the examples. As used herein, the singular forms "a", "an", and "the" are intended to include the plural forms as well, unless the context clearly indicates otherwise. It will be further understood that the terms "include/comprise" and/or "have" when used in this specification, specify the presence of stated features, integers, steps, operations, elements, components, and/or combinations thereof, but do not preclude the presence or addition of one or more other features, numbers, steps, operations, elements, components, and/or groups thereof.

Unless otherwise defined, all terms including technical and scientific terms used herein have the same meaning as commonly understood by one of ordinary skill in the art to which examples belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

When describing the examples with reference to the accompanying drawings, like reference numerals refer to like constituent elements and a repeated description related thereto will be omitted. When it is determined detailed description related to a related known function or configuration they may make the purpose of the examples unnecessarily ambiguous in describing the examples, the detailed description will be omitted here.

FIG. 1 is a graph illustrating an example of a degradation degree of a battery.

A battery pack includes a plurality of batteries connected to each other in series. In another example, the battery pack includes a plurality of batteries connected to each other in parallel.

In an embodiment in which a plurality of batteries is connected to each other in parallel, voltages of the plurality of batteries are equal to each other during charge and discharge cycles. However, amounts of currents flowing through the plurality of batteries differ from each other based on structural and functional characteristics of the batteries. In one example, one of the batteries may output a relatively large amount of current, and another battery may output a relatively small amount of current. Thus, self-balancing occurs and the batteries have substantially the same degradation degrees.

In a case in which a plurality of batteries is connected to each other in series, amounts of currents flowing through the plurality of batteries are equal to each other during charge and discharge cycles. In this example, voltages of the batteries change based on the structural and functional characteristics of the batteries. An amount of current output from a battery that stores a large amount of electric power is equal to an amount of current output from a battery that stores a small amount of electric power. Thus, self-balancing does not occur, and the batteries have different degradation rates. In the case in which the plurality of batteries is connected to each other in series, voltage curves and voltage slopes are observed as shown in FIG. 1.

FIG. 1 illustrates a voltage curve 110 and a voltage slope 111 of a battery with a relatively high degradation degree, and a voltage curve 120 and a voltage slope 121 of a battery with a relatively low degradation degree.

The battery with the relatively high degradation degree requires a relatively short period of time to reach a maximum available voltage, for example, 4 volts (V), during a charge cycle, compared to the battery with the relatively low degradation degree. Further, the battery with the relatively high degradation degree requires a relatively short period of time to reach a minimum available voltage, for example, 3 V, during a discharge cycle, compared to the battery with the relatively low degradation degree. For instance, the battery with the relatively high degradation degree shows a relatively considerable voltage variance during a provided period of time, for example, between t1 and t2 or between t2 and t3. In other words, during the provided period of time, for example, between t1 and t2 or between t2 and t3, an absolute value of the voltage slope 111 of the battery with the relatively high degradation degree is greater than an absolute value of the voltage slope 121 of the battery with the relatively low degradation degree.

Among a plurality of batteries being connected to each other, a battery with a relatively high degradation degree uses the entire available area, and a battery with a relatively low degradation degree uses a portion of the available area. A battery with a highest degradation degree shows a steepest voltage slope and, as a result, reaches a limitation of the available area sooner than other batteries. Further, a life of the battery, with the relatively high degradation rate, decreases relatively fast as a cycle repeats. Conversely, a life of the battery, with the relatively low degradation degree, decreases relatively slow as the cycle repeats. As the cycle repeats, a difference between the degradation degrees of the plurality of batteries increases. Thus, a degradation degree of the battery pack is dependent on the battery with the highest degradation degree, among the plurality of batteries included in the battery pack. In a case in which the battery pack is not used due to a high degradation degree of a predetermined battery, or a battery with a relatively low degradation degree is not used although such battery still has a remaining capacity, an efficiency of the battery pack decreases.

To resolve the efficiency problems associated with battery packs, in accordance with an embodiment, a battery management apparatus is configured to identify or to determine a battery with a relatively high degradation degree, among a plurality of batteries included in a battery pack, and define state information of the identified or determined battery as pack state information of a battery pack. Thus, the battery management apparatus provides more accurate pack state information to a user, and enables the battery pack to be efficiently used.

Figure 2:
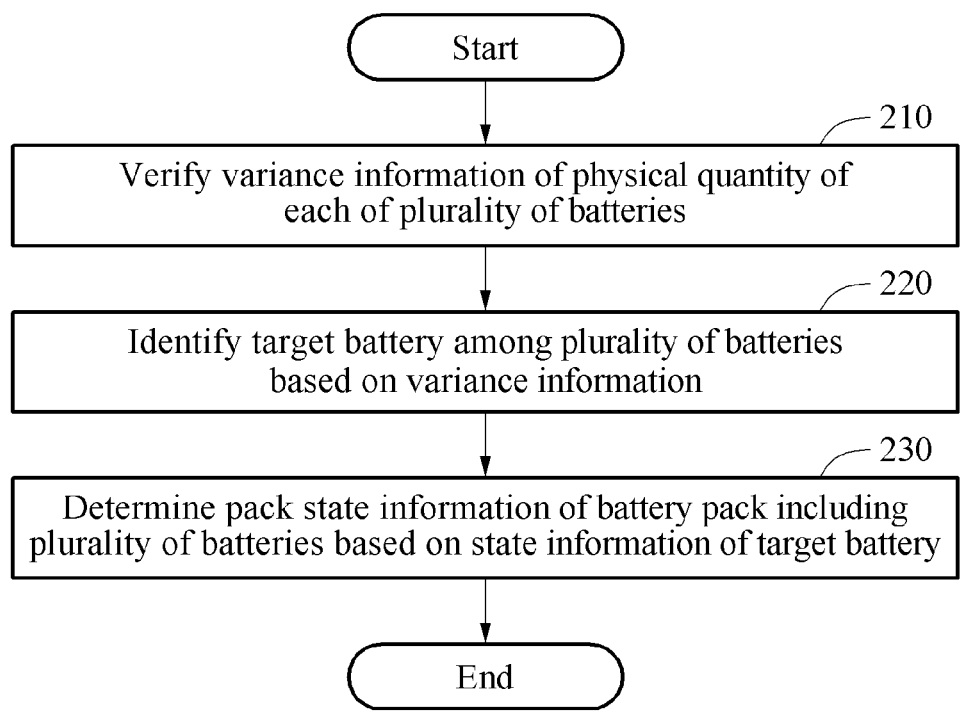
FIG. 2 is a flowchart illustrating an example of a battery management method.

FIG. 2 is a flowchart illustrating an example of a battery management method.

The battery management method of FIG. 2 is performed by a structural hardware or device including a battery management apparatus.

Referring to FIG. 2, in operation 210, the battery management apparatus verifies variance information of a physical quantity of each of a plurality of batteries. For example, the physical quantity includes one of voltage, current, and temperature or a combination thereof. For example, a first physical quantity of each of the plurality of batteries at a start point of a cycle is obtained, and a second physical quantity of each of the plurality of batteries at an end point of the cycle is obtained. The first physical quantity and the second physical quantity of each of the plurality of batteries are transmitted to the battery management apparatus. The battery management apparatus stores the first physical quantity and the second physical quantity in a memory. Upon determination that the cycle has ended, the battery management apparatus calculates a difference value between the first physical quantity and the second physical quantity of each of the plurality of batteries. The difference value of each of the plurality of batteries is calculated by (second physical quantity—first physical quantity). In doing so, when the cycle ends, the battery management apparatus verifies a variance in the physical quantity of each of the plurality of batteries during the cycle. A battery with a relatively high degradation degree has relatively considerable variance information. A battery with a relatively low degradation degree has relatively slight variance information. In other words, variance information corresponds to a degradation degree.

The variance information includes a voltage variance or a voltage slope as described with reference to FIG. 1.

In operation 220, the battery management apparatus identifies a target battery among the plurality of batteries based on the variance information of each of the plurality of batteries. In an example, the battery management apparatus defines a ranking of each of the plurality of batteries based on the variance information of each of the plurality of batteries. For example, the battery management apparatus defines the ranking of each of the plurality of batteries based on an absolute value of the difference value between the first physical quantity and the second physical quantity of each of the plurality of batteries. The battery with the relatively high degradation degree has a relatively high or considerable variance information or a relatively high or considerable difference value. As a result, the battery with the relatively high degradation degree is defined with a relatively high ranking. The battery with the relatively low degradation degree has relatively low or slight variance information or a relatively low or slight difference value. As a result, the battery with the relatively low degradation degree is defined with a relatively low ranking. Further, in accordance with an alternative embodiment, the battery with the relatively high degradation degree is determined to be ranked relatively low, and the battery with the relatively low degradation degree may be determined to be ranked relatively high.

Once the ranking of each of the plurality of batteries is determined, the battery management apparatus updates target identification information corresponding to each of the plurality of batteries based on a weight corresponding to the ranking. The battery management apparatus identifies the target battery, among the plurality of batteries, based on the updated target identification information of each of the plurality of batteries. For example, target identification information of a first battery corresponds to "10", target identification information of a second battery corresponds to "9", and target identification information of a third battery corresponds to "10.5". When a cycle ends, variances in physical quantities of the first battery, the second battery, and the third battery are verified. In a case in which variance information of the physical quantity of the first battery is most significant and variance information of the physical quantity of the third battery is slightest, the battery management apparatus determines the first battery to be ranked first, the second battery to be ranked second, and the third battery to be ranked third. The battery management apparatus updates target identification information corresponding to the first battery based on a weight of "5" corresponding to the first ranking. Similarly, the battery management apparatus updates target identification information corresponding to the second battery based on a weight of "3" corresponding to the second ranking, and updates target identification information corresponding to the third battery based on a weight of "1" corresponding to the third ranking.

When the cycle ends, the battery management apparatus updates the target identification information by adding the weight to the target identification information. For instance, the target identification information corresponding to the first battery is updated from "10" to "15". The target identification information corresponding to the second battery is updated from "9" to "12". The target identification information corresponding to the third battery is updated from "10.5" to "11.5". When the cycle ends, the first battery has the greatest target identification information. Thus, the battery management apparatus identifies the first battery to be the target battery.

The above descriptions of rankings and weights are provided as exemplary, and the various embodiment described herein are not limited thereto.

In operation 230, the battery management apparatus determines pack state information of a battery pack based on state information of the target battery. The battery pack includes a plurality of batteries. A battery is a battery cell or a battery module. In one embodiment, the plurality of batteries is connected to each other in series. However, in an alternative embodiment, the plurality of batteries may be connected to each other in parallel.

The battery management apparatus generates a control signal to obtain a target physical quantity. In an embodiment, the target physical quantity is a physical quantity of the target battery. The target physical quantity includes one of voltage, current, and temperature of the target battery or a combination thereof. The battery management apparatus transmits the control signal to the battery pack, and a sensor of the battery pack senses the target battery and obtains the target physical quantity based on the control signal. While the target physical quantity is being sensed, a physical quantity of another battery is not sensed. The battery pack transmits the target physical quantity to the battery management apparatus, and the battery management apparatus determines the state information of the target battery based on the target physical quantity. For example, the state information includes one of a state of health (SOH), a state of charge (SOC), a capacity, and a remaining useful life (RUL) or a combination thereof.

The battery management apparatus defines pack state information based on the state information of the target battery. For example, the pack state information includes one of an SOH, an SOC, a capacity, and an RUL or a combination thereof. As described above, in one embodiment, the battery management apparatus does not use state information of each of the plurality of batteries included in the battery pack to determine the pack state information. The battery management apparatus determines the state information of the target battery to be the pack state information, and does not use state information of other batteries to determine the pack state information of the battery pack. Thus, a size of a data storage space decreases from (number of batteries×data size) to (number of target batteries×data size). In another embodiment, the battery management apparatus may use the state information of at least one of the plurality of batteries included in the battery pack to determine the pack state information.

Figure 3A:
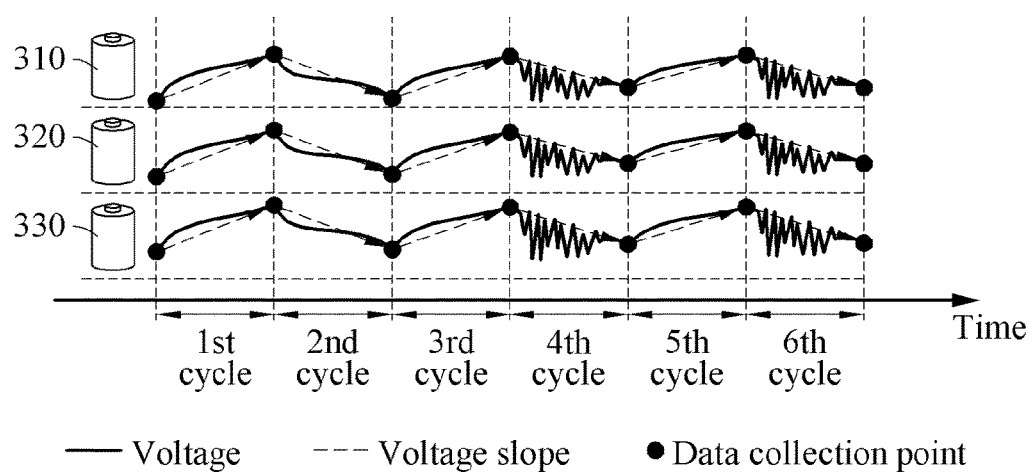
FIGS. 3A and 3B illustrate an example of the battery management method.
Figure 3B:
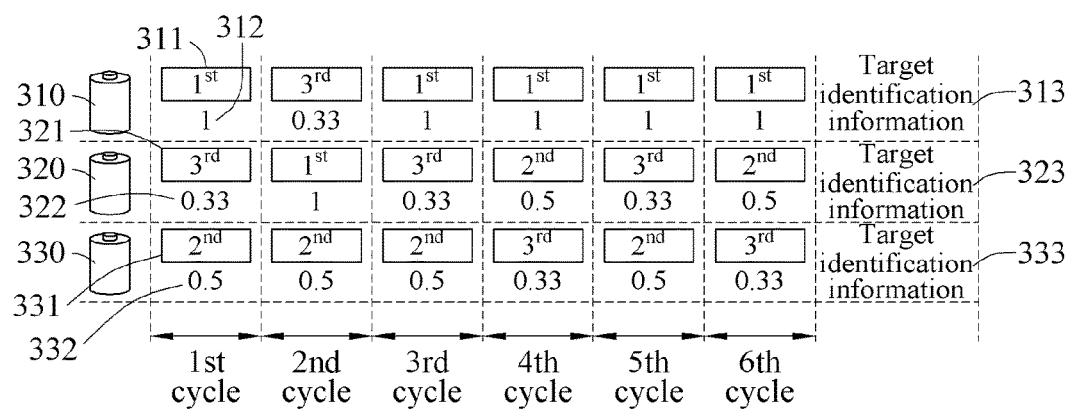

FIGS. 3A and 3B illustrate an example of a battery management method.

Referring to FIG. 3A, variance information of a physical quantity of each of a plurality of batteries 310, 320, and 330 is illustrated.

Hereinafter, examples are described based on a case in which the physical quantity corresponds to voltage. However, the physical quantity is not limited thereto by the descriptions provided below. The following descriptions may also be applicable to an electrical physical quantity except for voltage or a thermal physical quantity such as temperature or current.

A first cycle, a third cycle, and a fifth cycle correspond to charge cycles, and a second cycle, a fourth cycle, and a sixth cycle correspond to discharge cycles. A charge cycle may be a full charge cycle or a partial charge cycle, and a discharge cycle may be a full discharge cycle or a partial discharge cycle.

In a case in which the plurality of batteries 310, 320, and 330 is connected to each other in series, the plurality of batteries has different degradation degrees. Thus, the plurality of batteries 310, 320, and 330 has different voltage variances or different voltage slopes corresponding to each of the plurality of cycles. A voltage variance or a voltage slope of the battery 310 corresponding to the first cycle differs from voltage variances or voltage slopes of the other batteries 320 and 330 corresponding to the first cycle.

Referring to FIG. 3B, rankings and weights of each of the plurality of batteries 310, 320, and 330 are illustrated.

When the first cycle ends, the battery management apparatus calculates a voltage variance or a voltage slope of each of the plurality of batteries 310, 320, and 330. For example, voltages of the plurality of batteries 310, 320, and 330 at a start point of the first cycle are $Vs1\_1$, $Vs2\_1$, and $Vs3\_1$, respectively, and voltages of the plurality of batteries 310, 320, and 330 at an end point of the first cycle are $Ve1\_1$, $Ve2\_1$, and $Ve3\_1$, respectively. The battery management apparatus calculates $dV1\_1=|Vs1\_1-Ve1\_1|$, $dV2\_1=|Vs2\_1-Ve2\_1|$, and $dV3\_1=|Vs3\_1-Ve3\_1|$.

$dVx\_y$ denotes a voltage variance of a battery x corresponding to a y-th cycle. In one embodiment, a voltage slope of each battery is obtained by dividing a voltage variance of each battery by a time of the y-th cycle.

The battery management apparatus determines respective rankings 311, 321, and 331 of the plurality of batteries 310, 320, and 330 based on voltage variances corresponding to the plurality of batteries 310, 320, and 330. When the battery 310 has a most significant voltage variance, the battery management apparatus determines the battery 310 to be ranked first. When the battery 320 has a slightest voltage variance, the battery management apparatus determines the battery 320 to be ranked third. The battery management apparatus updates target identification information corresponding to the plurality of batteries 310, 320, and 330 based on weights 312, 322, and 332 corresponding to the rankings 311, 321, and 331. In the example shown in FIGS. 3A and 3B, there is no cycle prior to the first cycle. Thus, target identification information corresponding to each of the plurality of batteries 310, 320, and 330 corresponds to "0". The battery management apparatus updates the target identification information corresponding to each of the plurality of batteries 310, 320, and 330 based on a weight. In the example of FIG. 3B, the weights 312, 322, and 332 correspond to inverse numbers of the rankings 311, 321, and 331, respectively. Thus, the target identification information corresponding to the battery 310 is updated to "1", the target identification information corresponding to the battery 320 is updated to "0.33", and the target identification information corresponding to the battery 330 is updated to "0.5". When the first cycle ends, the battery 310 has the greatest target identification information. Thus, the battery management apparatus determines the battery 310 to be the target battery for the second cycle. The battery management apparatus defines state information of the battery 310 during the second cycle as the pack state information during the second cycle.

Similarly, the battery management apparatus determines a ranking of each of the plurality of batteries 310, 320, and 330 each time a cycle ends, and updates the target identification information corresponding to each of the plurality of batteries 310, 320, and 330. In detail, when the second cycle ends, the target identification information corresponding to the battery 310 is updated to "1.33", the target identification information corresponding to the battery 320 is updated to "1.33", and the target identification information corresponding to the battery 330 is updated to "1". When the third cycle ends, the target identification information corresponding to the battery 310 is updated to "2.33", the target identification information corresponding to the battery 320 is updated to "1.66", and the target identification information corresponding to the battery 330 is updated to "1.5".

When the sixth cycle ends, the battery management apparatus obtains target identification information 313, target identification information 323, and target identification information 333. The battery management apparatus obtains the target identification information 313, the target identification information 323, and the target identification information 333 by accumulating weights of the plurality of batteries 310, 320, and 330 corresponding to the plurality of cycles, respectively. For example, the target identification information 313 of the battery 310 corresponds to a sum of a cumulative weight of "4.33" corresponding to the first through fifth cycles and a weight of "1" corresponding to the sixth cycle. Similarly, each of the target identification information 323 and the target identification information 333 corresponds to a sum of a cumulative weight corresponding to the first through fifth cycles and a weight corresponding to the sixth cycle. When the sixth cycle ends, the target identification information 313 corresponds to "5.33", the target identification information 323 corresponds to "2.99", and the target identification information 333 corresponds to "2.66". The battery management apparatus decides the battery 310 to be the target battery.

In another example, the battery management apparatus obtains the target identification information 313 based on a cumulative weight corresponding to a predetermined period of time including at least one cycle previous to the sixth cycle and the weight corresponding to the sixth cycle. For example, the battery management apparatus obtains the target identification information 313 by adding a cumulative weight corresponding to a predetermined period of time including the third to fifth cycles to the weight corresponding to the sixth cycle. In this example, the target identification information 313 corresponds to "4". Similarly, the target identification information 323 corresponds to "1.66", and the target identification information 333 corresponds to "1.66". The battery management apparatus identifies the battery 310 to be the target battery.

In response to the battery 310 being identified to be the target battery, the battery management apparatus determines state information of the battery 310 based on a target physical quantity. The battery management apparatus defines the state information of the battery 310 as pack state information of a battery pack. Accordingly, pack state information during a seventh cycle is defined as the state information of the battery 310.

The descriptions provided with reference to FIGS. 1 and 2 are applicable to the matters described with reference to FIGS. 3A and 3B, and thus duplicated descriptions will be omitted for conciseness.

Figure 4:
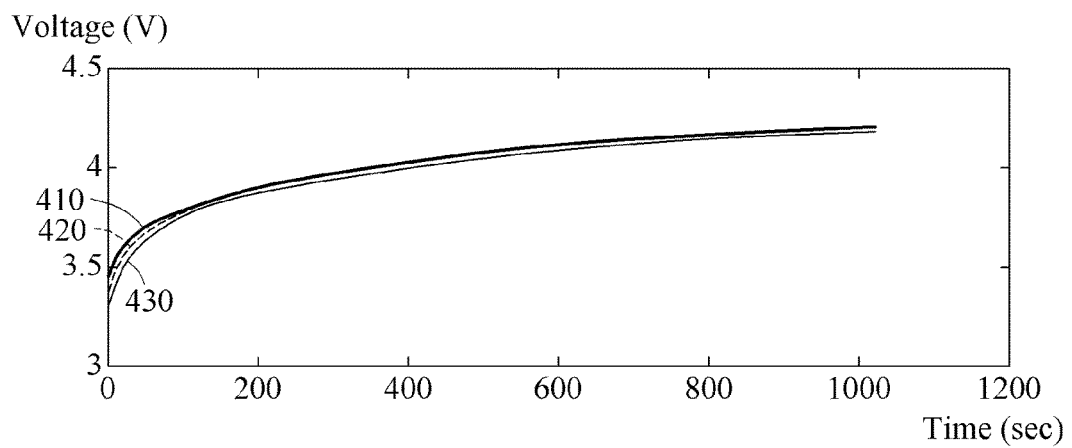
FIGS. 4 and 5 are graphs illustrating an example of variance information of a physical quantity of each of a plurality of batteries.
Figure 5:
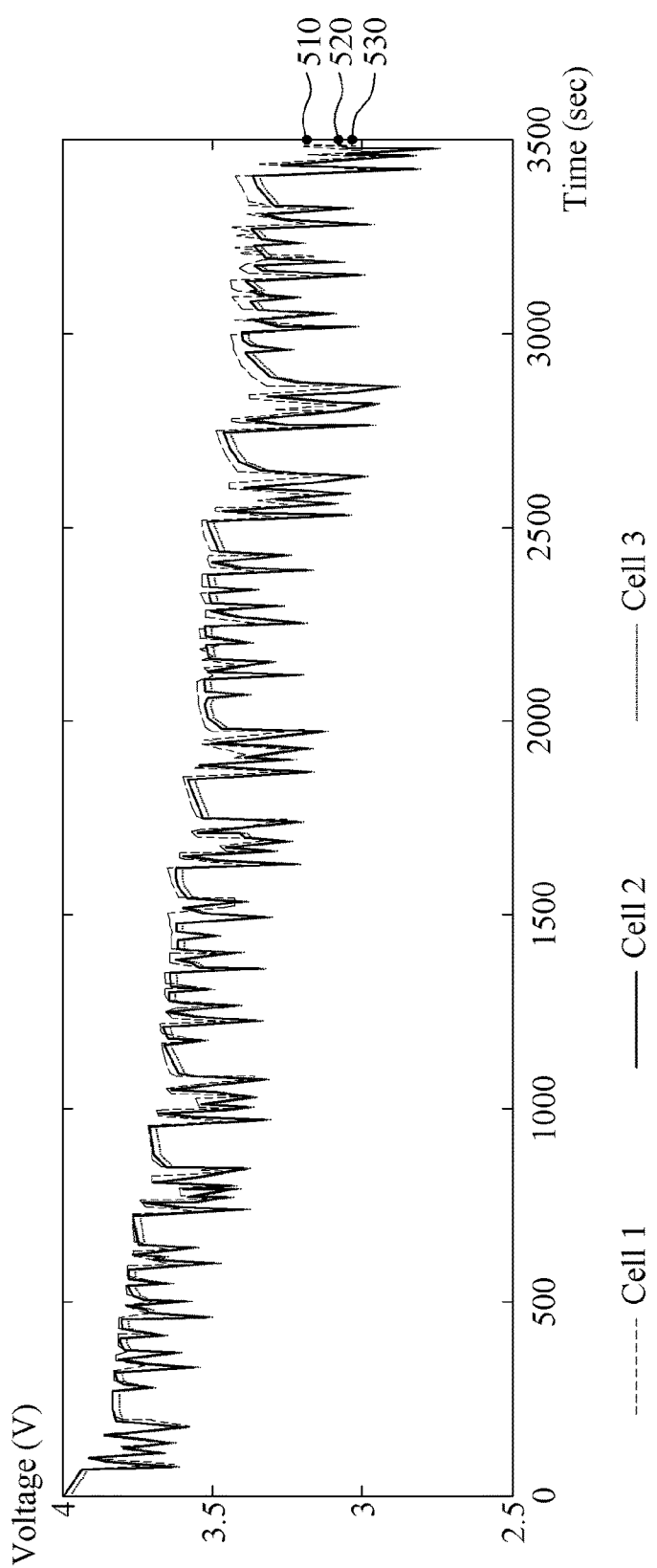

FIGS. 4 and 5 are graphs illustrating an example of variance information of a physical quantity of each of the plurality of batteries.

Referring to FIG. 4, a plurality of batteries is charged during a charge cycle, and voltages of the plurality of batteries change. In the graph of FIG. 4, during the charge cycle, a voltage slope of a voltage curve 430 is steeper than voltage slopes of other voltage curves 410 and 420. Thus, a battery corresponding to the voltage curve 430 is determined to be ranked relatively high.

Referring to FIG. 5, a plurality of batteries is discharged during a discharge cycle, and voltages of the plurality of batteries change. At an end point of the discharge cycle, the voltages of the plurality of batteries differ from each other. As described above, the plurality of batteries has different degradation degrees and; thus, the voltages of the plurality of batteries differ from each other at the end point. At the end point, a voltage 530 is lower than other voltages 510 and 520. An absolute value of a voltage slope of a voltage curve including the voltage 530 is greater than an absolute value of a voltage slope of a voltage curve including each of the voltage 510 and the voltage 520. Thus, a battery corresponding to the voltage 530 is determined to be ranked relatively high.

Figure 6:
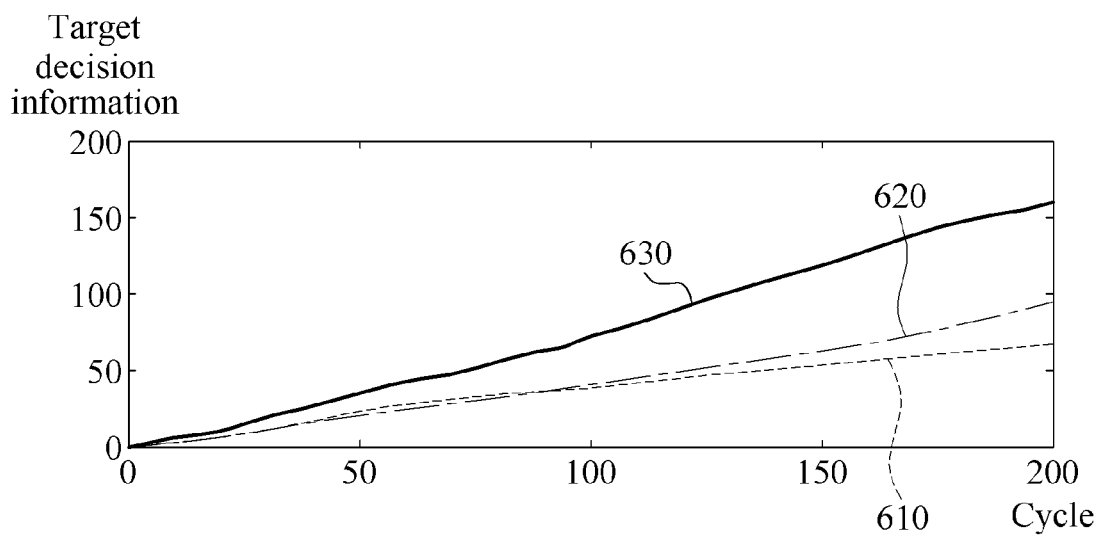
FIG. 6 is a graph illustrating an example of target identification information.

FIG. 6 is a graph illustrating an example of target identification information.

Referring to FIG. 6, target identification information with respect to a cycle is illustrated.

In the graph of FIG. 6, when a 200th cycle ends, target identification information 630 is greater than target identification information 610 and target identification information 620. As described above, a battery with a high degradation degree is determined to be ranked high. Since weights corresponding to rankings are accumulated, great target identification information is obtained.

A battery corresponding to the target identification information 630 is decided to be a target battery for a 201st cycle.

FIGS. 7A, 7B, 7C, and 7D illustrate examples of a battery system.

Figure 7A:
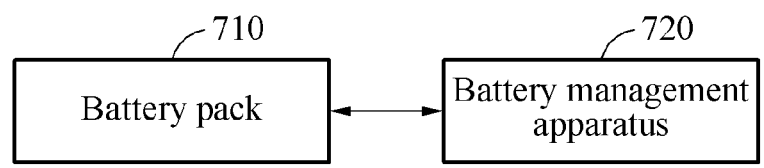

Referring to FIG. 7A, a battery system 700 includes a battery pack 710, and a battery management apparatus 720.

The battery pack 710 includes at least one battery. The at least one battery is a battery module or a battery cell. The battery pack 710 is provided in an nSmP structure. In an embodiment, n and m are integers, S denotes series, and P denotes parallel. Hereinafter, structures of the battery pack 710 will be described with reference to FIGS. 7B and 7C.

Figure 7B:
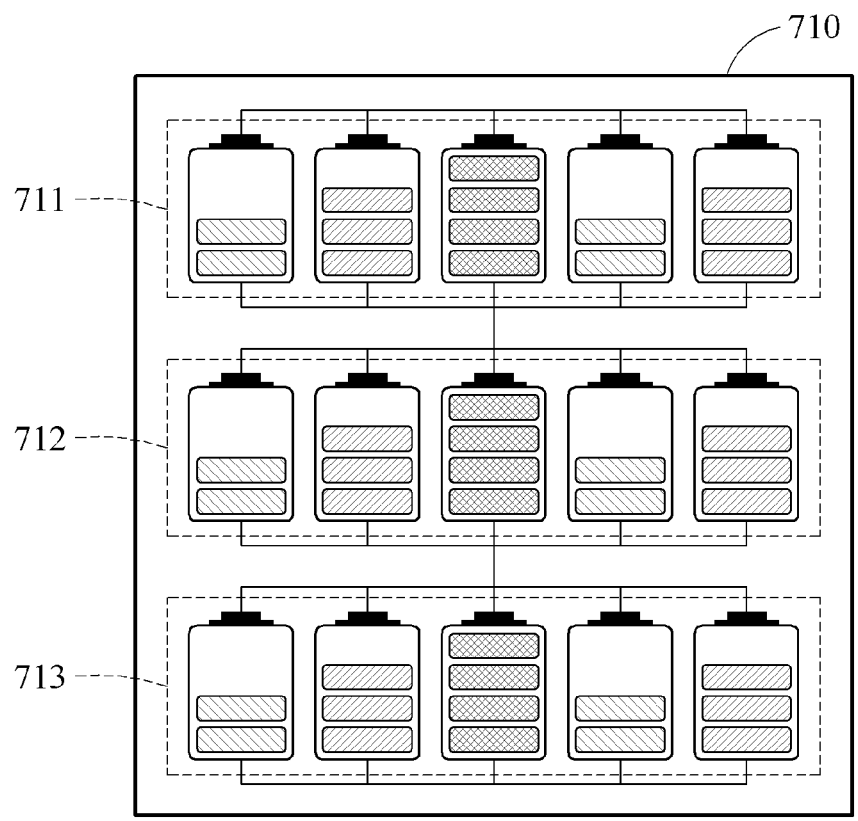

Referring to FIG. 7B, an example of the battery pack 710 is illustrated. The battery pack 710 includes a plurality of battery modules 711, 712, and 713 being connected to each other in series. Each of the plurality of battery modules 711, 712, and 713 includes a plurality of battery cells being connected to each other in parallel. In FIG. 7B, the battery pack 710 is provided in a 3S5P structure.

Figure 7C:
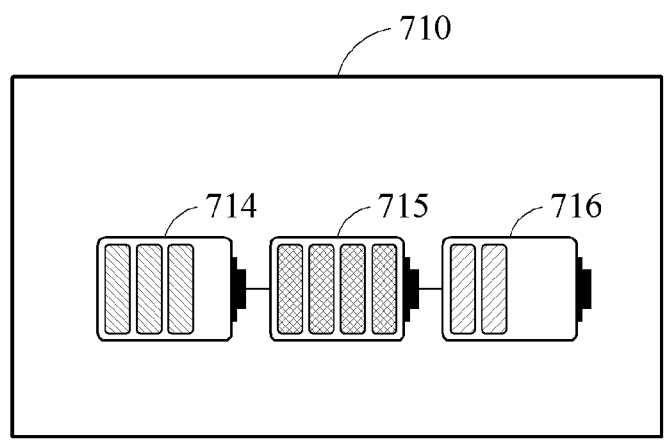

Referring to FIG. 7C, another example of the battery pack 710 is illustrated. The battery pack 710 includes a plurality of battery cells 714, 715, and 716 being connected to each other in series. In FIG. 7C, the battery pack 710 is provided in a 3S1P structure.

Referring to FIG. 7A again, the battery management apparatus 720 manages and/or controls the battery pack 710. The battery management apparatus 720 executes software implementing an algorithm to perform the battery management method described above. In one example, the battery management apparatus 720 is a processor or computer including, or connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIG. 2. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The battery management apparatus 720 may be implemented in a form of a chip to be mounted on an electric control unit (ECU). The battery management apparatus 720 may be implemented in a form of a physical board to communicate with an ECU. The battery management apparatus 720 may be implemented using hardware components. Examples of hardware components include controllers, sensors, generators, drivers, and any other electronic components known to one of ordinary skill in the art. In one example, the hardware components are implemented by one or more processors or computers. The battery management apparatus 720 may be mounted on a large-capacity battery management system such as an energy storage system (ESS), or an electrical or hybrid vehicle. The battery management apparatus 720 may be mounted on an electronic device or a device management system including a rechargeable battery. The electronic device may include, for example, various types of physical applications such as a laptop computer, a tablet computer, a smartphone, and a wearable device.

The battery management apparatus 720 defines pack state information of the battery pack 710. As described above, the pack state information includes one of an SOH, an SOC, a capacity, and an RUL or a combination thereof. The SOH is expressed by a ratio of a current capacity to an initial capacity of a battery. However, examples are not limited thereto. The SOH may be expressed using various schemes.

The battery management apparatus 720 defines the pack state information based on a physical quantity of a predetermined battery, rather than based on a physical quantity of each of the plurality of batteries included in the battery pack 710. Hereinafter, an example of the battery management apparatus 720 will be described with reference to FIG. 7D.

Referring to FIG. 7D, the battery management apparatus 720 includes a variance verifier 721, a ranking determiner and weight accumulator 722, a target identifier 723, a controller 724, a target state determiner 725, and a pack state definer 726.

The variance verifier 721, the ranking determiner and weight accumulator 722, the target decider 723, the controller 724, the target state determiner 725, and the pack state definer 726 are implemented using at least one processor. Although each of the variance verifier 721, the ranking determiner and weight accumulator 722, the target decider 723, the controller 724, the target state determiner 725, and the pack state definer 726 are illustrated as separate structural elements, a person skilled in the relevant art will appreciate that such structural elements may be combined into a single structural element such as a single processor or a single controller.

The battery pack 710 includes a plurality of batteries.

A battery may be a battery module. As described with reference to FIG. 7B, the battery pack 710 includes a plurality of battery modules being connected to each other in series. Each of the plurality of battery modules includes a plurality of battery cells being connected to each other in parallel. As to be described below, the battery management apparatus 720 identifies a target battery module among the plurality of battery modules, and determines state information of the target battery module to be the pack state information.

In another example, a battery may be a battery cell. As described with reference to FIG. 7C, the battery pack 710 includes a plurality of battery cells being connected to each other in series. As to be described below, the battery management apparatus 720 identifies a target battery cell among the plurality of battery cells, and determines state information of the target battery cell to be the pack state information.

The aforementioned structures of the battery pack 710 are provided as exemplary. The structures of the battery pack 710 are not limited thereto.

The sensor 730 senses a first physical quantity of each of the plurality of batteries at a start point of a cycle, and senses a second physical quantity of each of the plurality of batteries at an end point of the cycle. The battery pack 710 transmits the first physical quantity and the second physical quantity of each of the plurality of batteries to the battery management apparatus 720.

In the example of FIG. 7D, the sensor 730 is disposed in the battery pack 710. However, examples are not limited thereto. The sensor 730 may be disposed outside the battery pack 710. Further, in the example of FIG. 7D, a single sensor 730 is connected to the plurality of batteries, and configured to sense a physical quantity of each of the plurality of batteries. However, examples are not limited thereto. A plurality of sensors may sense physical quantities of the plurality of batteries, respectively. For example, a sensor corresponding to each of the plurality of batteries may sense a physical quantity of the corresponding battery.

The controller 724 includes a communication interface to perform controller area network (CAN) communication, and receives the first physical quantity and the second physical quantity of each of the plurality of batteries. When the cycle ends, the controller 724 transfers the first physical quantity and the second physical quantity of each of the plurality of batteries to the variance verifier 721.

The variance verifier 721 verifies variance information of each of the plurality of batteries. For example, the variance verifier 721 calculates a difference value between the first physical quantity and the second physical quantity.

The ranking determiner and weight accumulator 722 determines a ranking of each of the plurality of batteries based on the variance information of each of the plurality of batteries. Further, the ranking determiner and weight accumulator 722 accumulates weights corresponding to rankings of each of the plurality of batteries, and applies a cumulative value of the weights to target identification information corresponding to each of the plurality of batteries. In doing so, the target identification information corresponding to each of the plurality of batteries is updated.

The target identifier 723 identifies a target battery among the plurality of batteries. A process of deciding the target battery is described above and; thus, duplicated descriptions will be omitted for conciseness.

In a case in which the middle battery is identified to be the target battery, the controller 724 transmits, to the battery pack 710, a control signal to obtain a physical quantity of the middle battery, in detail, a target physical quantity. The sensor 730 senses the target physical quantity based on the control signal. In this embodiment, the sensor 730 does not sense physical quantities of the other batteries. However, in an alternative embodiment, the sensor 730 may be configured to sense the physical quantities of more than one of the batteries. The controller 742 receives the target physical quantity from the battery pack 710, and transfers the target physical quantity to the target state determiner 725.

The target state determiner 725 determines state information of the target battery based on the target physical quantity. In response to the state information of the target battery being determined, the pack state definer 726 defines the state information of the target battery of the battery pack 710 as pack state information.

The descriptions provided with reference to FIGS. 1 through 6 are applicable to the matters described with reference to FIGS. 7A through 7D and; thus, duplicated descriptions will be omitted for conciseness.

Figure 8:
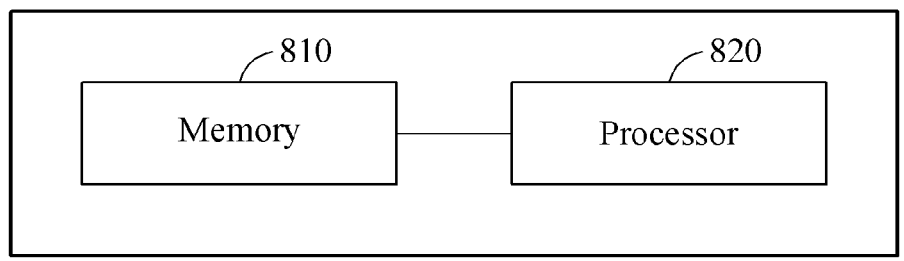
FIG. 8 is a block diagram illustrating an example of a battery management apparatus.

FIG. 8 is a block diagram illustrating an example of a battery management apparatus.

Referring to FIG. 8, a battery management apparatus 800 includes a memory 810 and a processor 820.

The memory 810 stores a physical quantity of each of a plurality of batteries. For example, the memory 810 stores a first physical quantity of each of the plurality of batteries at a start point of a cycle and a second physical quantity of each of the plurality of batteries at an end point of the cycle.

The processor 820 verifies variance information of the physical quantity of each of the plurality of batteries, and identifies a target battery, among the plurality of batteries, based on the variance information. For example, the processor 820 determines a ranking of each of the plurality of batteries based on the variance information of the physical quantity of each of the plurality of batteries, and identifies the target battery based on the ranking.

The processor 820 determines pack state information of a battery pack based on state information of the target battery.

The processor 820 implements the variance verifier 721, the ranking determiner and weight accumulator 722, the target decider 723, the controller 724, the target state determiner 725, and the pack state definer 726 of FIG. 7D.

The descriptions provided with reference to FIGS. 1 through 7D are applicable to the matters described with reference to FIG. 8 and; thus, duplicated descriptions will be omitted for conciseness.

Figure 9:
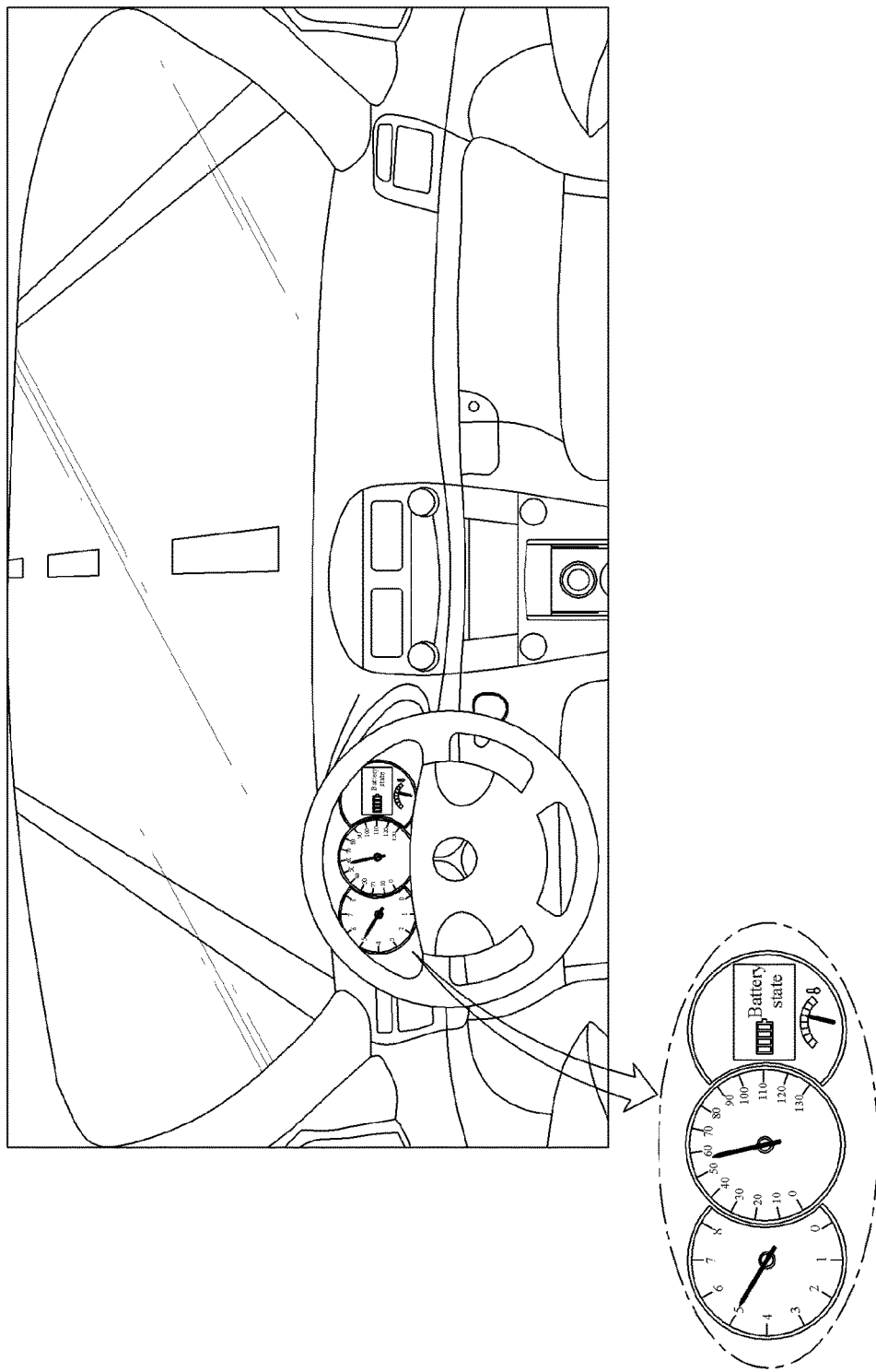
FIG. 9 illustrates an example of an operation of the battery management apparatus.

FIG. 9 illustrates an example of an operation of a battery management apparatus.

An electrical vehicle includes a battery pack, and a battery management apparatus.

In a case in which the electrical vehicle is in operation, a discharge cycle starts. In a case in which the operation of the electrical vehicle is terminated, the discharge cycle ends. When the discharge cycle ends, the battery management apparatus identifies a target battery among a plurality of batteries included in the battery pack, and defines pack state information of the battery pack. The battery management apparatus displays the pack state information on a dashboard. Further, the battery management apparatus transmits the pack state information to a terminal of a user. Accordingly, the user verifies an SOC and an SOH of the battery pack.

The apparatuses, memory, processors, battery packs, determiner, identifier, definer, accumulator, verifier, and identifier, and other components illustrated in FIGS. 7D and 8 that perform the operations described herein with respect to FIG. 2 are implemented by hardware components including, but limited to, controllers, sensors, generators, drivers, and any other electronic components known to one of ordinary skill in the art. In one example, the hardware components are implemented by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A processor-implemented method for controlling a battery pack, the method comprising:
   verifying variance information of a physical quantity of each of a plurality of batteries, wherein the variance information corresponds to a variance in the physical quantity during a cycle, and the cycle comprises at least one of a full charge cycle, a full discharge cycle, a partial charge cycle, and a partial discharge cycle;
   identifying a target battery among the batteries based on the variance information;
   determining pack state information of the battery pack comprising the batteries based on state information of the target battery; and
   controlling the battery pack based on the determined pack state information.

2. The method of claim 1, wherein the identifying comprises
   determining a ranking of each of the batteries based on the variance information; and
   identifying the target battery, among the batteries, based on the ranking.

3. The method of claim 1, wherein the identifying comprises
   determining a ranking of each of the batteries based on the variance information corresponding to the cycle;
   updating target identification information corresponding to each of the batteries based on a weight corresponding to the ranking; and
   identifying the target battery based on the updated target identification information.

4. The method of claim 3, wherein target identification information to be updated corresponds to a cumulative value of weights corresponding to rankings of each of the batteries, the rankings respectively determined in response to each of cycles previous to the cycle terminating.

5. The method of claim 3, wherein the updated target identification information corresponds to a sum of target identification information to be updated and the weight.

6. The method of claim 1, wherein the verifying comprises calculating a difference value between a first physical quantity of each of the batteries at a start point of the cycle and a second physical quantity of each of the batteries at an end point of the cycle.

7. The method of claim 6, wherein the identifying comprises identifying the target battery, among the batteries, based on an absolute value of the difference value.

8. The method of claim 1, wherein the determining comprises
   receiving a target physical quantity of the target battery;
   determining the state information based on the target physical quantity; and
   determining the state information to be the pack state information.

9. The method of claim 8, further comprising
   generating a control signal to obtain the target physical quantity; and
   transmitting the control signal to the battery pack,
   wherein the receiving comprises receiving the target physical quantity sensed by a sensor of the battery back.

10. The method of claim 8, wherein the determining excludes receiving of a physical quantity of other batteries and sensing of state information of the other batteries.

11. The method of claim 1, wherein the variance information corresponds to a degradation degree of each of the plurality of batteries.

12. The method of claim 1, wherein the physical quantity comprises one of voltage, current, and temperature or a combination thereof and the variance information comprises a voltage variance or a voltage slope.

13. The method of claim 1, wherein the identifying comprises
   defining the target battery as a battery comprising a relatively high degradation degree having a high variance information and with a high ranking relative to other of the batteries.

14. A non-transitory computer-readable storage medium storing instructions that, when executed by a processor, cause the processor to perform a method, the method comprising:
   verifying variance information of a physical quantity of each of a plurality of batteries;

identifying a target battery among the batteries based on the variance information;

determining pack state information of the battery pack comprising the batteries based on state information of the target battery; and controlling the battery pack based on the determined pack state information.

15. An apparatus for controlling a battery pack, comprising:

a memory configured to store a physical quantity of each of a plurality of batteries; and a processor configured to identify a target battery, among the batteries, based on variance information of the physical quantity, wherein the variance information corresponds to a variance in the physical quantity during a cycle and the cycle comprises at least one of a full charge cycle, a full discharge cycle, a partial charge cycle, and a partial discharge cycle, determine pack state information of the battery pack comprising the batteries based on state information of the target battery, and control the battery pack based on the determined pack state information.

16. The apparatus of claim 15, wherein the processor is configured to determine a ranking of each of the batteries based on the variance information, and identify the target battery, among the batteries, based on the ranking.

17. The apparatus of claim 16, wherein the processor is configured to determine a ranking of each of the batteries based on the variance information corresponding to the cycle, update target identification information corresponding to each of the batteries based on a weight corresponding to the ranking, and identify the target battery based on the updated target identification information.

18. The apparatus of claim 17, wherein target identification information to be updated corresponds to a cumulative value of weights corresponding to rankings of each of the batteries, the rankings respectively determined in response to each of cycles previous to the cycle terminates.

19. The apparatus of claim 17, wherein the updated target identification information corresponds to a sum of target identification information to be updated and the weight.

20. The apparatus of claim 15, wherein the processor is configured to calculate a difference value between a first physical quantity of each of the batteries at a start point of the cycle and a second physical quantity of each of the batteries at an end point of the cycle.

21. The apparatus of claim 15, wherein, in response to the target battery being identified, the processor is configured to receive a target physical quantity of the target battery through a communication interface, determine the state information based on the target physical quantity, and determine the state information to be the pack state information.

22. The apparatus of claim 15, wherein the variance information corresponds to a degradation degree of each of the batteries.

* * * * *